United States Patent [19]

Hamaie et al.

[11] Patent Number: 4,958,764
[45] Date of Patent: Sep. 25, 1990

[54] DIE-BONDING METHOD OF PELLETS

[75] Inventors: Buji Hamaie, Innoshima; Kyoichi Ago, Kurashiki; Kazufumi Hatano, Okayama, all of Japan

[73] Assignee: Rohm Co., Ltd., Kyoto, Japan

[21] Appl. No.: 448,277

[22] Filed: Dec. 11, 1989

[30] Foreign Application Priority Data

Dec. 12, 1988 [JP] Japan .................. 63-314247

[51] Int. Cl.⁵ .................. B23K 37/047; H05K 3/34
[52] U.S. Cl. .................. 228/248; 228/123; 228/41; 156/91; 156/281; 156/325; 29/832
[58] Field of Search .................. 228/123, 179, 180.2, 228/180.1, 248, 33, 41, 47, 52, 256; 29/832; 156/91, 230, 278, 281, 297, 299, 325

[56] References Cited

U.S. PATENT DOCUMENTS 4,396,140  8/1983  Jaffe et al. .................. 228/123

FOREIGN PATENT DOCUMENTS 3127120  1/1983  Fed. Rep. of Germany ........ 29/832

OTHER PUBLICATIONS

IBM Technical Disclosure Bulletin, "Selective Molten Solder Applicator for Arrays", vol. 32, No. 7, pp. 180, 181, Dec. 1989.

IBM Technical Disclosure Bulletin, "Mechanically Controlled Thermal Joining", vol. 32, No. 8A, pp. 164, 165, Jan. 1990.

*Primary Examiner*—Sam Heinrich
*Assistant Examiner*—Samuel M. Heinrich
*Attorney, Agent, or Firm*—Wenderoth, Lind & Ponack

[57] ABSTRACT

A die-bonding method of pellets, which includes a first step for causing a first paste to adhere to a forward end of a needle, a second step for lowering the needle from above a pellet located at a first position so as to cause the first paste stuck to the forward end of the needle at the first step, to adhere to the upper portion of the pellet, and also, to displace the pellet in a state where the pellet is held at the forward end of the needle by an adhesive force of the first paste, a third step for lowering the lower portion of the pellet held by the first paste at the forward end of the needle, onto a predetermined portion of a frame applied with a second paste, and a fourth step for raising the needle after the third step.

3 Claims, 3 Drawing Sheets

DIE-BONDING METHOD OF PELLETS

BACKGROUND OF THE INVENTION

The present invention generally relates to a mounting method, and more particularly, to a die-bonding method for pellets and the like.

Referring to FIGS. 3A and 3B, a conventional die-bonding method for pellets will be described hereinafter.

In the first place, as shown in FIG. 3A, a needle 12 having a through-bore 10 for evacuation or vacuum formation provided therein is brought into contact with an upper portion or bump portion of a pellet 8 (a diode with a bump at its upper portion in this example) located at a first position as it is accommodated within a recess 4 of a pellet holding jig 2, through evacuation via a through-bore 6 formed at the bottom portion of said recess 4, by lowering said needle 12 from an imaginary line position indicated by a two-dotted chain line to a position shown by a solid line in a direction of an arrow a, whereby the pellet 8 is attracted onto the forward end of the needle 12, in which state, said needle 12 is raised in a direction indicated by an arrow b. Subsequently, the needle 12 is horizontally moved in a direction indicated by an arrow c, i.e. towards a paste 18 applied at a predetermined portion of a frame 16 disposed on a base 14 at a second position, and then, as shown in FIG. 3B, the needle 12 is lowered in a direction of an arrow d from the imaginary line position shown by the two-dotted chain line to the solid line position, thereby to bring the pellet 8 attracted onto the forward end of the needle 12, into contact with the paste 18. Thereafter, the pellet 8 is caused to adhere to the paste 18 by releasing the through-bore 10 of the needle 12 from the evacuation, and thus, die-bonding of the pellet 8 onto the frame 16 is completed.

In the known die-bonding practice as described so far, however, there has been such a problem that, since it is required to subject the through-bore 10 of the needle 12 to the evacuation or vacuum formation, and also, to effect a timing control for the evacuation, as the number of pellets to be die-bonded increases, vacuum forming systems corresponding in number to such an increase becomes necessary, and as a result, the arrangement on the whole is extremely complicated, with a consequent rise in cost.

Another problem inherent in the conventional die-bonding method is such that, when the needle 12 in a state where no pellet 8 is attracted by vacuum to its forward end is lowered with respect to the second paste 18 in the direction of the arrow d in FIG. 3B and the forward end thereof contacts the paste 18, there is a possibility that the through-bore 10 of the needle 12 is undesirably closed or clogged by the paste 18, and detecting control system for detecting whether or not any pellet 8 is attracted onto the forward end of the needle 12, etc., is also required. From such a point, not only complication and high cost of the entire arrangement are involved, but, the possibility of clogging the forward end of the needle 12 by such contact will remarkably reduce reliability of the die-bonding arrangement.

SUMMARY OF THE INVENTION

Accordingly, an essential object of the present invention is to provide a die-bonding method for pellets or the like, which is simple in steps for simplification, reduction in cost and high reliability of an arrangement to carry out said method.

Another object of the present invention is to provide a die-bonding method as described above, which may be readily introduced into various production lines in an efficient manner.

In accomplishing these and other objects, according to one preferred embodiment of the present invention, there is provided a die-boning method for pellets, which includes a first step for causing a first paste to adhere to a forward end of a needle, a second step for lowering the needle from above a pellet located at a first position so as to cause the first paste stuck to the forward end of the needle at said first step, to adhere to the upper portion of said pellet, and also, to displace the pellet in a state where said pellet is held at the forward end of the needle by an adhesive force of the first paste, a third step for lowering the lower portion of said pellet held by the first paste at the forward end of said needle, onto a predetermined portion of a frame applied with a second paste, and a fourth step for raising said needle after said third step.

In the above die-bonding practice of the present invention, the first paste is caused to adhere to the forward end of the needle at the first step. In the second step, the needle is lowered onto the pellet located a the first position from above the upper portion of said pellet for causing the first paste stuck to the forward end of the needle at the first step, to adhere to said upper portion, thereby to displace the pellet in a state where it is held at the forward end of the needle by the adhesive force of said first paste. At the third step, the lower portion of the pellet held by the first paste at the forward end of the needle in said second step is lowered onto the predetermined portion of the frame at which the second paste has been applied, with the first paste contacting the upper portion of said pellet. Finally, at the fourth step, the needle is raised after said third step.

Therefore, according to the die-bonding method of the present invention as referred to above, the evacuating or vacuum forming device may be dispensed with, while owing to unnecessity for providing any through-bore within the needle, the die-bonding arrangement may be simplified in construction on the whole, with a consequent reduction in cost. Furthermore, owing to absence of the through-bore in the needle, there is no possibility that such a through-bore is clogged by the second paste, with the result that any detecting control system corresponding to such clogging may be dispensed with. Therefore, from this aspect also, the whole arrangement can be further simplified and reduced in cost, while the reliability of its functioning may be improved to a large extent.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1A:
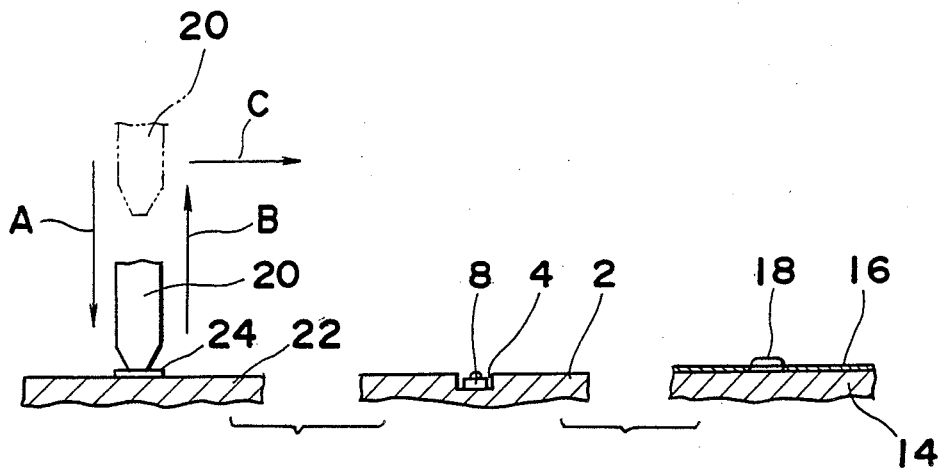
FIGS. 1A to 1D are fragmentary side sectional diagrams for explaining steps of a die-bonding method for pellets according to one preferred embodiment of the present invention.

Before the description of the present invention proceeds, it is to be noted that like parts are designated by like reference numerals throughout the accompanying drawings.

Referring now to the drawings, a die-bonding method for pellets according to one preferred embodiment of the present invention will be explained with reference to FIGS. 1A to 1D.

Figure 3A:
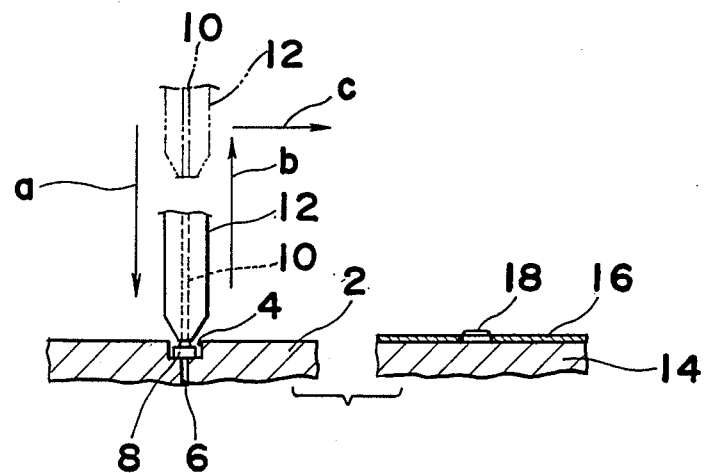
FIGS. 3A and 3B are diagrams similar to those of FIGS. 1A to 1D, which are particularly related to a conventional die-bonding method (already referred to).
Figure 3B:
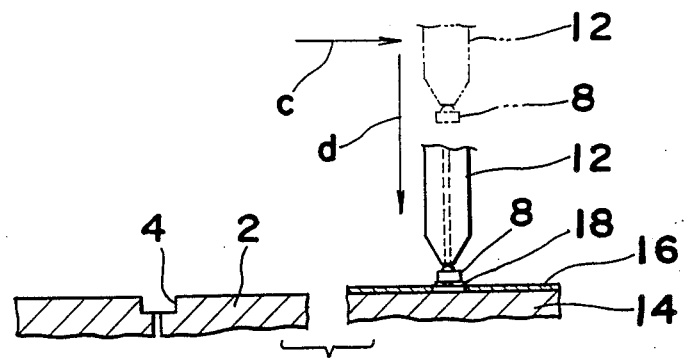

In the first place, it is to be noted that the die-bonding method of the present invention is particularly characterized in that a needle 20 for effecting said method is not provided with an evacuating or vacuum forming through-bore therein as in the conventional arrangement described earlier with reference to FIGS. 3A and 3B.

In a first step of the die-bonding method according to the present invention, as shown in FIG. 1A, the needle 20 is lowered in the direction indicated by the arrow A from an imaginary line position shown by a two-dotted chain line to a position indicated by a solid line position so as to bring the forward end of the needle 20 into contact with a first paste 24 placed on a proper base 22, thereby to cause part (referred to as adhering or stuck paste 24a hereinafter) of the first paste 24 to adhere to said forward end, and then, the needle 20 is raised in a direction of an arrow B for a subsequent displacement in a horizontal direction indicated by an arrow C.

Figure 1B:
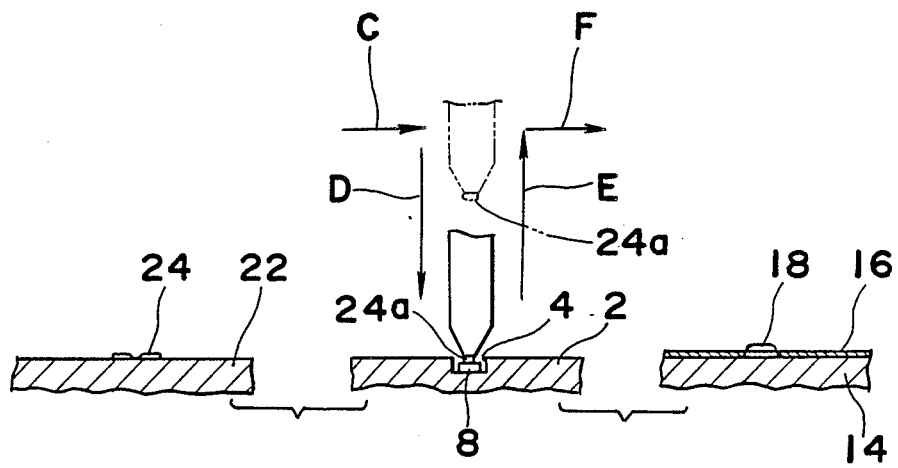

In a second step, at a first position in the direction C for the horizontal displacement of the needle 20, as shown in FIG. 1B, the needle 20 is lowered in the direction of the arrow D from above the upper portion of the pellet 8 accommodated within the recess 4 of the holding jig 2 so as to bring the forward end of the needle 20 into contact with said upper portion of the pellet 8, and thus, the paste 24a stuck to the forward end of he needle 20 in the first step is caused to adhere to the bump portion at the upper portion of the pellet 8. Then, the needle 20 is raised in a direction of an arrow E, with the pellet 8 held at the forward end thereof by the above adhesion, and is then horizontally displaced in a direction of an arrow F to a second position.

Figure 1C:
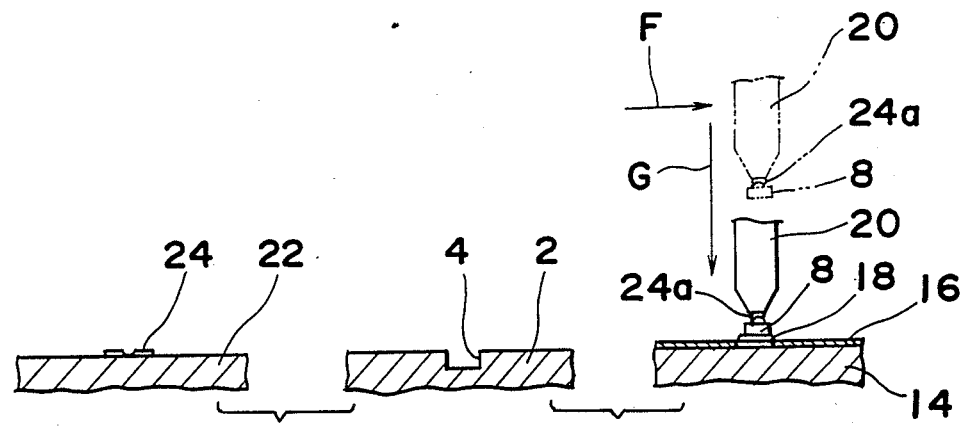

Subsequently, at a third step, as shown in FIG. 1C, the lower portion of the pellet 8 held at the forward end of the needle 20 by the stuck paste 24a in the second step is lowered in the direction of an arrow G onto a predetermined position of the frame 16 to which the second paste 18 has been applied for contact with said paste 18, with the stuck paste 24a at the forward end of the needle 20 contacting the bump portion of said pellet 8.

Figure 1D:
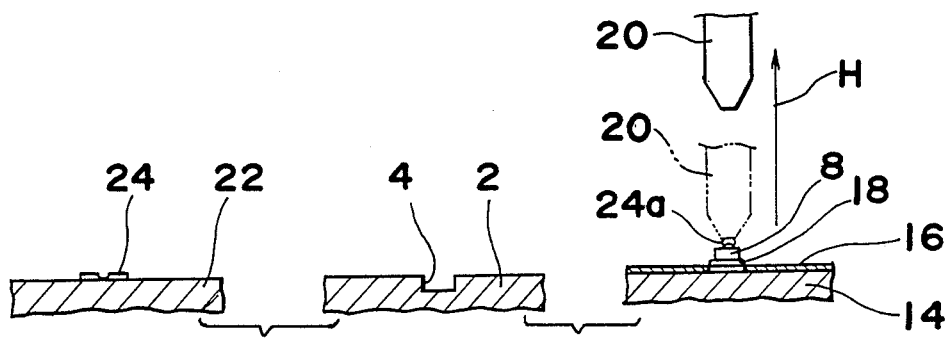

Finally, at a fourth step, the needle 20 is raised in the direction of an arrow H as shown in FIG. 1D. In this case, since an applied area of the second paste 18 is larger than that of the stuck paste 24a, when the needle 20 is raised in the direction of the arrow H, there is no possibility that the pellet 8 is lifted together with the needle 20.

As is seen from the above description, according to the die-bonding method of the present invention, the evacuating or vacuum forming through-bore conventionally required may be dispensed with in the construction of the needle 20 itself, and consequently, neither a vacuum forming device nor control device for setting timing for the evacuation is necessary.

Figure 2:
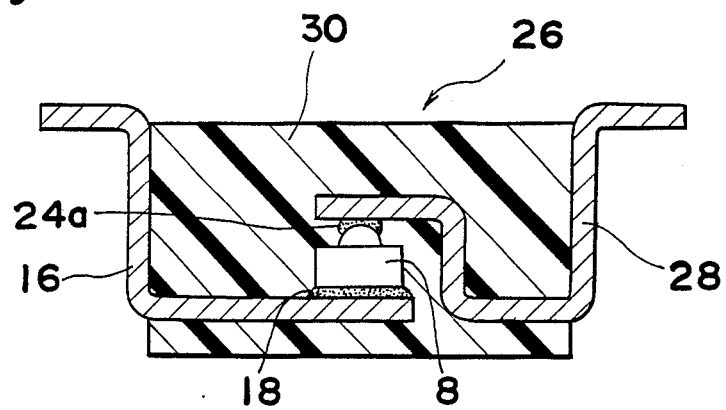
FIG. 2 is a side sectional view showing a general construction of a diode produced by the die-bonding method according to the present invention.

Referring also to FIG. 2, there is shown a general construction of a diode 26 manufactured based on the die-bonding method according to the present invention as described so far.

In FIG. 2, the diode 26 shown in FIG. 2 has the lower portion of the pellet 8 die-bonded onto the paste 18 of the lead frame 16, with a lead frame 28 being fixed to the stuck paste 24a on the upper portion of the pellet 8, and both of the lead frames 16 and 28 are extended outwardly from a resin mold portion 30 which covers the assembly so as to serve as external leads.

In the diode 26 having the construction as described above, since the stuck paste 24a is initially present on the bump portion at the upper portion of the pellet, it becomes unnecessary to particularly provide a bonding agent for the bonding of the bump portion of the diode and the lead frame 28.

As is clear from the foregoing description, according to the die-bonding method of the present invention, since it is not required to employ an arrangement in which a through-bore is provided within the needle for evacuation, not only the entire construction is simplified for reduction in cost, but, owing to the fact that there is no possibility of clogging of the through-bore as in the conventional practice, the detection and control system for such clogging may also be dispensed with, and consequently, it becomes possible to further simplify the entire construction and reduce the cost involved, while the reliability of the arrangement may be improved to a large extent as compared with the conventional method due to absence of possibility of clogging.

Although the present invention has been fully description by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A die-bonding method for pellets, which comprises:
 a first step for causing a first paste to adhere to a forward end of a needle,
 a second step for lowering the needle from above a pellet located at a first position so as to cause the first paste stuck to the forward end of the needle at said first step, to adhere to the upper portion of said pellet, and also to displace the pellet in a state where said pellet is held at the forward end of the needle by an adhesive force of the first paste,
 a third step for lowering the lower portion o said pellet held by the first paste at the forward end of said needle, onto a predetermined portion of a frame applied with a second paste, and
 a fourth step for raising said needle after said third step.

2. A die-bonding method for pellets, which comprises:
 a first step for causing a first paste to adhere to a forward end of a pellet handling means
 a second step for lowering the pellet handling means from above a pellet located at a first position so as to cause the first paste stuck to the forward end of the pellet handling means at said first step, to adhere to the upper portion of said pellet, and also, to displace the pellet in a state where said pellet is held at the forward end of the pellet handling means by an adhesive force of the first paste, a third step for lowering the lower portion of said pellet held by the first paste at the forward end of said pellet handling means, onto a predetermined portion of a frame applied with a second paste, and a fourth step for raising said pellet handling means after said third step.

3. A die-bonding method as claimed in claim 3, wherein said pellet handling means is in the form of a needle.

* * * * *